United States Patent [19]

Hills et al.

[11] Patent Number: 5,149,281
[45] Date of Patent: Sep. 22, 1992

[54] TEST ENABLING TERMINAL ENCLOSURE APPARATUS AND METHOD

[75] Inventors: Gerritt G. Hills; Vicki L. Hills, both of Austin, Tex.

[73] Assignee: Teltronics, Inc., Austin, Tex.

[21] Appl. No.: 764,542

[22] Filed: Sep. 24, 1991

[51] Int. Cl.$^5$ .............................. H01R 13/52
[52] U.S. Cl. .................... 439/521; 439/912; 439/936
[58] Field of Search ............ 439/519, 521, 522, 523, 439/426, 912, 921, 936; 174/76, 138 F

[56] References Cited

U.S. PATENT DOCUMENTS

| | | |
|---|---|---|
| 3,844,725 | 5/1975 | Schmidt ........................ 439/522 X |
| 3,960,427 | 6/1976 | Piaget et al. ................... 439/521 X |
| 4,053,705 | 10/1977 | Schmidt ........................ 439/521 X |
| 4,600,261 | 7/1986 | Debbaut . |
| 4,634,207 | 1/1987 | Debbaut . |
| 4,643,924 | 2/1987 | Uken et al. . |
| 4,674,820 | 6/1987 | Foster et al. ................... 439/522 |
| 4,685,756 | 8/1987 | Gamara . |
| 4,690,831 | 9/1987 | Uken et al. . |
| 4,796,159 | 1/1989 | Miksche ........................ 439/64 X |
| 4,883,431 | 11/1989 | Uken et al. . |
| 4,988,309 | 1/1991 | Garretson ...................... 439/521 X |

FOREIGN PATENT DOCUMENTS 2009527 6/1979 United Kingdom .

*Primary Examiner*—Larry I. Schwartz
*Assistant Examiner*—Khiem Nguyen
*Attorney, Agent, or Firm*—Shaffer & Culbertson

[57] ABSTRACT

A gel-filled enclosure for protecting an electrical contact member and connection includes an enclosure opening arrangement through which an elongated probe may be inserted into the gel-filled enclosure cavity. The enclosure opening allows a probe to be inserted into the enclosure cavity to make contact with the protected electrical contact member without having to remove and replace the enclosure. The gel within the enclosure is self-healing and fills in the opening made by the probe after the probe is withdrawn. The enclosure preferably includes a contact member receiving arrangement within the enclosure body that includes a contact member receiving tube and a plurality of thread-engaging ribs positioned in the tube. Each rib is formed from a self-threading plastic material and self-threads as the enclosure is screwed down over a threaded contact member.

14 Claims, 2 Drawing Sheets

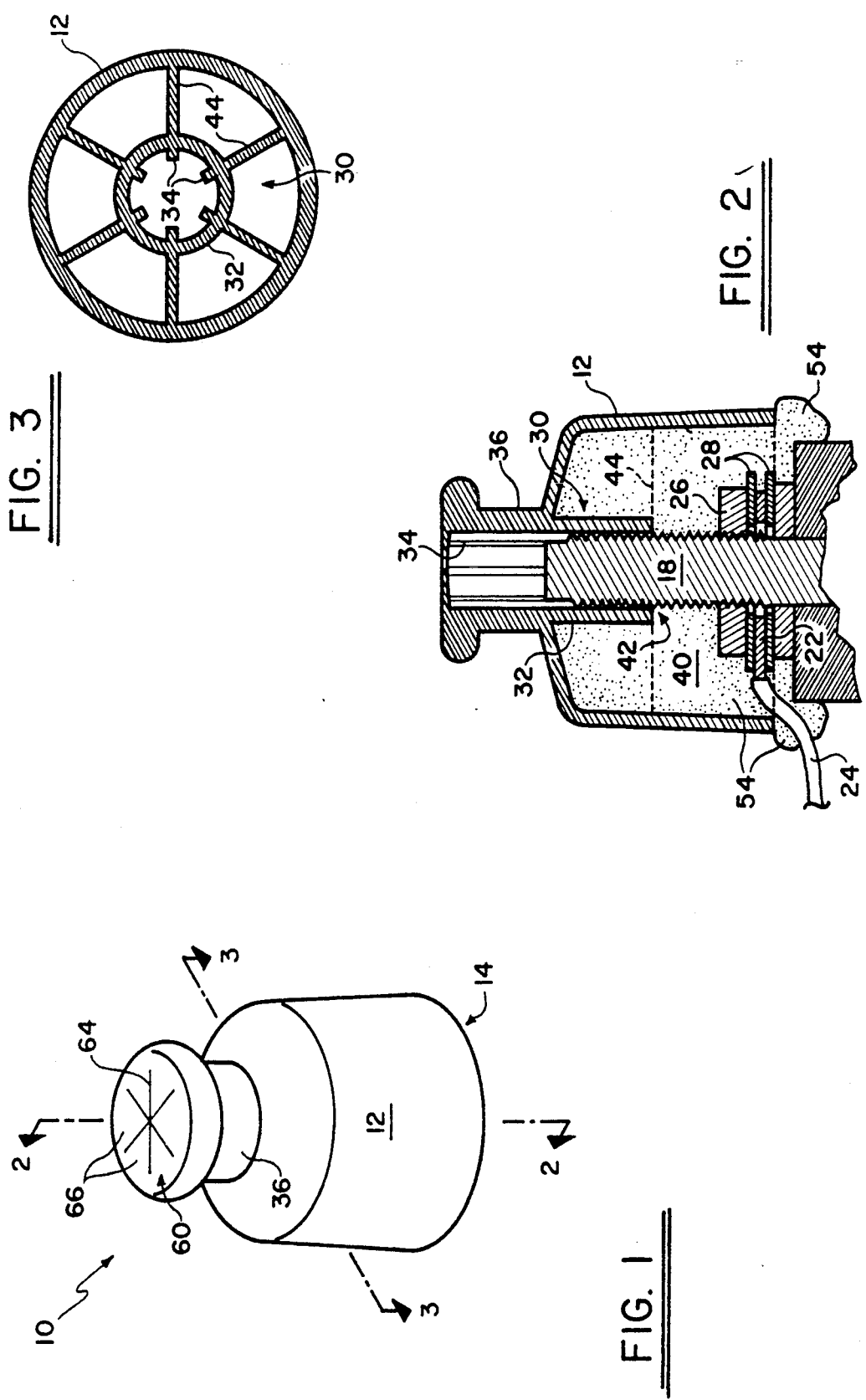

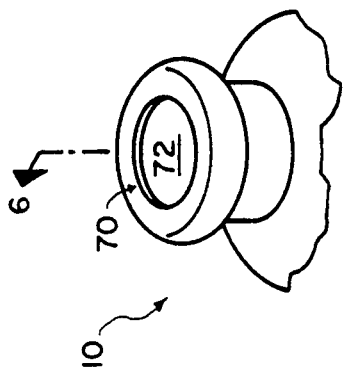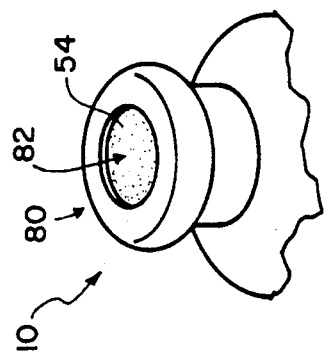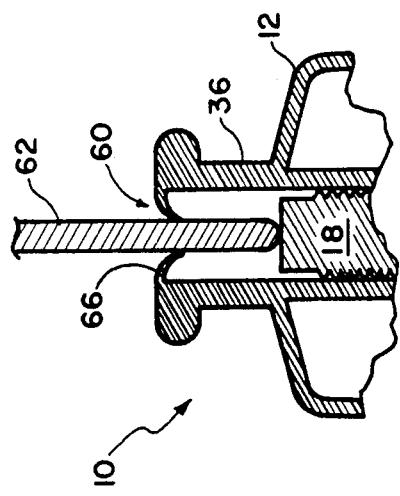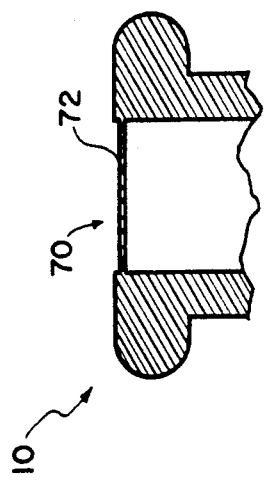

TEST ENABLING TERMINAL ENCLOSURE APPARATUS AND METHOD

BACKGROUND OF THE INVENTION

This invention relates to encapsulant-filled electrical terminate or contact enclosures and particularly to a gel-filled enclosure that provides a secure connection to a contact member and allows the enclosed contact member to be tested without removing the enclosure. The invention also encompasses a method for protecting an electrical contact member and connection with an encapsulant-filled enclosure while allowing the contact to be tested without removing the enclosure.

Telecommunications and other wire connections to a terminal or contact on a substrate often require individual protection at each connection. In telecommunications applications it is common to have a plurality of elongated electrical contact members extending from a substrate with each contact forming a terminal for one or more telecommunications wire ends. The connection is made by connecting the wire end around the base of the contact member and then tightening a nut on the contact member to hold the wire in place. The individual terminal connections are protected by connecting a gel or other encapsulant-filled cap or enclosure over the contact member, nut, and wire end. The encapsulant material provides a seal around the exposed electrically conductive material to protect the electrical connection from moisture and other damaging contaminants, and the enclosure serves to retain the encapsulant material in place.

There were a number of problems associated with prior art encapsulant-filled enclosures for electrical contacts or terminals. One problem was that the caps or enclosures had to be removed in order to test the terminal. Once the caps were removed they generally could not be reused to provide an effective seal and had to be replaced by a new cap. Another problem with prior encapsulant-filled caps was that the caps could not be connected securely to the terminal. The poorly connected caps or enclosures tended to fall off leaving the terminal unprotected.

SUMMARY OF THE INVENTION

It is a general object of the invention to provide a terminal enclosure and enclosing method that overcomes the above described problems and others associated with prior enclosures and enclosing methods.

An enclosure or cap embodying the principles of the invention comprises an enclosure body that may be secured over an electrical contact member to cover and protect the contact member along with an electrical wire connected at the base of the contact member. A self-healing gel or other encapsulant is contained in the enclosure body to provide a water impervious seal around the contact member and the exposed wire end. The enclosure body includes enclosure opening means formed therein to enable a test probe to be inserted into the interior of the enclosure body. When the enclosure body is secured over a contact member, a test probe may be inserted through the enclosure opening means to test the protected contact member without having to remove the enclosure body. When the probe is removed from the enclosure body through the enclosure opening means, the self-healing encapsulant fills in the passageway formed by the probe to again seal around the contact member and provide protection against moisture and other contaminants.

The invention encompasses several alternative enclosure opening means. In one form of the invention the enclosure opening means comprises a plurality of reduced-thickness slits formed in the enclosure body material and intersecting at a center point to form a series of adjacent pie-slice shaped sections. The reduced thickness slits tear easily, particularly at the center intersection point, to form an opening capable of admitting a test probe into the enclosure body.

In another form of the invention the enclosure opening means comprises a section of material on the enclosure body having a substantially reduced thickness. The reduced-thickness material or membrane is readily puncturable and may be punctured with the probe to allow insertion and testing.

Still another form of the enclosure opening means comprises a small probe opening located at a suitable point on the enclosure body. In this form of the invention, the enclosure body still serves to shield and retain the encapsulant material in a sealing position around the contact member. However, the test probe need only penetrate the encapsulant to make contact with and test the protected contact member.

Another aspect of the enclosure according to the invention concerns an improved contact member receiving arrangement for threaded contact members. The improved contact member receiving arrangement comprises an elongated tube mounted within the enclosure body. A plurality of elongated ribs are mounted within the tube at various angular orientations and extend inwardly toward the tube center axis. Each of the ribs is made from a suitable self-threading material, preferably the same plastic material from which the entire enclosure is formed. As the enclosure is rotated into a protecting position over a threaded contact member, the threads on the contact member cut into and thread the ribs to securely fasten the enclosure in the protecting position.

The preferred form of the invention utilizes a silicone gel as an encapsulant. The preferred silicone gel exhibits a cone penetration value of under 90 $10^{-1}$ mm. Cone penetration values in this range provide improved sealing around the base of the contact member and attached wire, and also provide good self-healing properties to reseal the contact member after a test probe is removed.

These and other objects, advantages, and features of the invention will be apparent from the following description of the preferred embodiments, considered along with the accompanying drawings.

BRIEF DESCRIPTION OF THE DRAWINGS

FIG. 1 is a view in perspective of a contact member enclosure embodying the principles of the invention.

FIG. 2 is a view in longitudinal section taken along line 2—2 in FIG. 1, with the enclosure positioned in a protecting position on a contact member.

FIG. 3 is a view in transverse section taken along line 3—3 in FIG. 1.

FIG. 4 is a partial view in longitudinal section similar to FIG. 2, but showing a test probe inserted through the enclosure opening means.

FIG. 5 is a partial view in perspective of an alternate embodiment of the enclosure.

FIG. 6 is a view in longitudinal section taken along line 6—6 in FIG. 5.

FIG. 7 is a partial view in perspective showing another alternate form of the enclosure.

DESCRIPTION OF THE PREFERRED EMBODIMENTS

FIGS. 1-4 show one preferred form of electrical contact enclosure 10 embodying the principles of the invention. The enclosure 10 comprises an elongated enclosure body 12 having a contact member receiving end 14 with a contact member receiving opening 16 therein. As shown in FIG. 2, the enclosure 10 is adapted to connect in a protecting position over an elongated electrical contact member 18 extending from a substrate 20. The electrical contact member 18 forms a terminal for an electrically conductive wire 22 that is enclosed along its length within an insulating material 24 and exposed only at the end in order to make electrical contact with the contact member. A nut 26 and suitable washers 28 are used to retain the wire 22 in good electrical contact with the electrical contact member 18. The enclosure body 12 is adapted to substantially cover and enclose the contact member 18, nut 26, washers 28, and exposed wire end 22.

As shown particularly in FIGS. 2 and 3, the enclosure 10 also includes contact member receiving means indicated generally at reference number 30. The preferred contact member receiving means 30 comprises an elongated tube 32 mounted substantially coaxially within the elongated enclosure body 12, and a plurality of thread-engaging ribs 34 mounted within the tube. The tube 32 extends from a narrow handle section 36 of the enclosure body 12 to a cavity forming portion and terminates with an open tube end 42 in an enclosure cavity 40. A plurality of connecting ribs 44 extend from the outer surface of the tube 32 in the enclosure cavity 40 to the enclosure body 12. Each of the thread-engaging ribs 34 within the tube 32 extends substantially the length of the tube and is connected at one transverse end 46 to the inner surface of the tube with the opposite transverse end 48 extending radially inwardly toward the tube longitudinal axis. Preferably, the thread-engaging ribs 34 are each made from a plastic material that may be cut or threaded as the elongated enclosure body 12 is rotated about its longitudinal axis and pressed downwardly over the contact member 18.

Referring to FIG. 2, the elongated enclosure body 12 is substantially filled with a suitable dielectric encapsulant material 54. The function of the encapsulant material 54 is to capsulate and seal around the exposed electrical contact member 18 wire end 22, nut 26, and washers 28. Sealing is required to prevent moisture and other contaminants from reaching any of the exposed electrically conductive material. The preferred encapsulant material 54 is a self-healing silicone gel having a cone penetration value under 90 $10^{-1}$ mm For example, the silicone gel marketed under the trademark SYLGARD 527, by Dow Corning Corporation, provides the desired dielectric and cone penetration values. This material also exhibits desirable adhesive and self-healing characteristics.

Referring particularly to FIGS. 1 and 4, the enclosure 10 also includes enclosure opening means indicated generally at reference number 60. The enclosure opening means 60 is formed in the enclosure body material and is adapted to allow an elongated probe 62 to be inserted into the enclosure cavity 40 to make electrical contact with the contact member 18. In the preferred form of the invention shown in FIGS. 1 through 4, the enclosure opening means 60 comprises a plurality of elongated slits 64 formed in the end of the enclosure handle section 36, opposite to the contact member receiving end 14. Each elongated slit 64 comprises an area of relatively thinner and readily tearable material and the slits intersect at a center point to form a series of pie-slice shaped sections 66

Although the enclosure 10 is shown in FIGS. 1 through 4 as having a separate handle section 36, those skilled in the art will readily appreciate that the enclosure may alternatively be cylindrical in shape with no separate handle section. Alternatively, the enclosure body may have a polygonal or oblong transverse cross-sectional shape. Regardless of the particular shape of the enclosure, the enclosure is preferably formed in one piece with the contact member receiving means 30 and enclosure opening means 60 from a suitable plastic material. For example, the enclosure 10 may be formed using a suitable injection moulding process.

The operation of the enclosure 10 and the method of the invention may be described best with reference to FIG. 4. The cavity 40 of the enclosure body 12 is first substantially filled with the encapsulant material 54. After the enclosure cavity 40 is substantially filled, the method includes threading the enclosure body 12 and contact member receiving means 30 over the contact member 18 to a protecting position in which the contact member receiving end 14 of the enclosure body substantially reaches the insulated wire 22 extending to the base of the contact member. The male threaded contact member 18 cuts receiving threads into the ribs 34 formed in the tube 32 to produce a secure connection between the contact member and the enclosure 10. Also, as the contact member 18 advances into the enclosure cavity 40, it displaces a portion of the encapsulant material 54 downwardly out of the opening 16 at the contact member receiving end 14 of the enclosure body 12. The displaced encapsulant material 54 flows around and seals the exposed wire, retaining nut and washers, and contact member base.

With the enclosure 10 in place in the protecting position on the electrical contact member 18, the elongated probe 62 may be inserted through the enclosure opening means 30 into the enclosure cavity 40 to make contact with the electrical contact member 18 received in the cavity. In the form of the invention shown in FIGS. 1 through 4, the elongated slits 64 tear under pressure applied by the probe 62 at the slit intersection point, and the ends of the adjacent pie-slice shaped sections 66 peal downwardly to form an opening through which the probe passes. After the test is completed and the probe withdrawn from the enclosure cavity 40, the encapsulant material 54 reforms the seal around the contact member 18 to again protect the contact member from contaminating material such as moisture. Preferably, the enclosure body 12 is formed from a sufficiently resilient plastic material that the ends of the adjacent pie-slice shaped section 66 return generally to their initial position to help protect and enclose the encapsulant material 54.

FIGS. 5 and 6 show an enclosure 10 having an alternate enclosure opening means 70 according to the invention. This alternate enclosure opening means 70 comprises an area of readily puncturable material 72 formed on the enclosure body 12. The preferred puncturable material comprises a thin membrane that is easily torn with a probe such as that shown in FIG. 4. Similar to the embodiment shown in FIGS. 1-4, the readily puncturable membrane allows the probe to be inserted to make contact with an enclosed electrical contact member without having to remove the enclosure 10.

An enclosure 10 with another alternate form of enclosure opening means 80 is shown in FIG. 7. In this form of the invention the enclosure opening means 80 comprises a probe receiving opening 82 rather than a tearable or puncturable material. As with the other forms of the invention, the encapsulant 54 provides the contaminant-proof seal and the enclosure body 12 still serves to hold the encapsulant in a sealing position around a contact member such as that shown in FIG. 4.

Each of the alternate forms of enclosure opening means 60, 70, and 80 shown in the figures are positioned at the end of the enclosure body opposite to the contact member receiving end. The opening means may, however, be located at any point on the enclosure body that will allow an elongated probe to reach the protected contact member. Also, still further alternate enclosure opening means may comprise an opening adapted to be selectively covered with a cover. The cover may be connected or hinged to the enclosure body or may be completely separable from the enclosure body.

The above described preferred embodiments are intended to illustrate the principles of the invention, but not to limit the scope of the invention. Various other embodiments and modifications to these preferred embodiments may be made by those skilled in the art without departing from the scope of the following claims.

We claim:

1. An enclosure for protecting an electrical contact member, the enclosure comprising:
   (a) an elongated enclosure body defining an enclosure cavity and having a contact member receiving end with a contact member receiving opening therein;
   (b) contact member receiving means connected to the enclosure body and positioned within the enclosure cavity for receiving the contact member in a contact member receiving area and retaining the enclosure body in a contact member protecting position substantially covering the contact member;
   (c) a self-healing encapsulant substantially filling the enclosure cavity; and
   (d) enclosure opening means for providing an opening in the enclosure body through which an elongated probe may be inserted into the enclose cavity to make contact with the contact member when the contact member is received therein, the enclosure opening means being formed in the enclosure body in an area removed from the contact member receiving end and spaced from the contact member receiving area so that an interval of the encapsulant separates the enclosure opening means from the contact member receiving area.

2. The apparatus of claim 1 wherein the self-healing encapsulant comprises:
   (a) a silicone gel having a cone penetration value of below 90 $10^{-1}$ mm.

3. The apparatus of claim 1 wherein the contact member is elongated and threaded and the contact member receiving means comprises:
   (a) an elongated tube mounted substantially coaxially within the elongated enclosure body and having a tube opening at the end of the tube nearest to the contact member receiving end of the enclosure body; and
   (b) a plurality of elongated thread-engaging ribs extending longitudinally within the tube, each rib being formed from a self-threading plastic material and having one transverse end connected to an inner surface of the tube and the opposite transverse end extending radially inwardly toward the tube longitudinal axis.

4. The apparatus of claim 1 wherein the enclosure opening means comprises:
   (a) a probe receiving opening formed in the enclosure body.

5. The apparatus of claim 1 wherein the enclosure opening means comprises:
   (a) a reduced-thickness and readily puncturable area of material formed in the enclosure body.

6. The apparatus of claim 1 wherein the enclosure opening means comprises:
   (a) a plurality of elongated and readily tearable reduced-thickness slits formed in the enclosure body material, the elongated slits intersecting at a center point to form therebetween a series of pie-slice shaped sections.

7. The apparatus of claim 1 wherein the enclosure opening means is positioned at an end of the enclosure body opposite to the contact member receiving end and enables the elongated probe to be inserted into the contact member receiving area.

8. In an encapsulant-filled cap for use in protecting an exposed end of an electrical contact member, the cap having a cap body substantially filled with a self-healing dielectric encapsulant, a contact member receiving opening, and contact member receiving means mounted within the cap body for receiving the contact member in a contact member receiving area and securing the cap in a protecting position in which it substantially covers the contact member, the improvement comprising:
   (a) cap opening means formed in the cap body separate from the contact member receiving opening so that a layer of the encapsulant is interposed between the cap opening means and the contact member receiving area, the cap opening means for enabling an elongated probe to be inserted therethrough to penetrate through the encapsulant and make electrical contact with the contact member when the contact member is received in the contact receiving means.

9. The apparatus of claim 8 wherein the cap opening means comprises:
   (a) a probe receiving opening.

10. The apparatus of claim 8 wherein the cap opening means comprises:
    (a) a reduced-thickness and readily puncturable area of material formed in the cap body.

11. The apparatus of claim 8 wherein the enclosure opening means comprises:
    (a) a plurality of elongated and readily tearable reduced-thickness slits formed in the cap body, the slits intersecting at a center point to form therebetween a series of pie-slice shaped sections.

12. The apparatus of claim 8 wherein the encapsulant in the cap comprises:
    (a) a silicone gel having a cone penetration value of below 90 $10^{-1}$ mm.

13. The encapsulant-filled cap of claim 8 wherein:
    (a) the cap opening means is also for contacting the elongated probe to prevent removal of encapsulant as the probe is retracted from the cap through the cap opening means.

14. A method of providing an electrically insulated protecting enclosure for an elongated electrical contact member while allowing the enclosed electrical contact member to be contact tested without removing the enclosure, the method comprising the steps of:
 (a) substantially filling an enclosure cavity of an elongated enclosure body with a self-healing silicone gel having a cone penetration value of under 90 $10^{-1}$ mm, the enclosure body having a contact member receiving end with a contact member receiving opening formed therethrough and enclosure opening means formed separately from the contact member receiving opening; and
 (b) securing the gel-filled enclosure body over the contact member with the contact member extending through the contact member receiving opening and with a portion of the contact member separated from the enclosure opening means by only the self-healing silicone gel.

* * * * *

UNITED STATES PATENT AND TRADEMARK OFFICE
CERTIFICATE OF CORRECTION

PATENT NO. : 5,149,281

DATED : September 22, 1992

INVENTOR(S) : Gerritt G. Hills and Vicki L. Hills

It is certified that error appears in the above-identified patent and that said Letters Patent is hereby corrected as shown below:

Claim 1, Column 5, line 48:

Delete "enclose" and insert in its place --enclosure--.

Signed and Sealed this

Twenty-first Day of September, 1993

Attest:

BRUCE LEHMAN

*Attesting Officer*    *Commissioner of Patents and Trademarks*